United States Patent [19]
Chen et al.

[11] Patent Number: 5,185,276
[45] Date of Patent: Feb. 9, 1993

[54] METHOD FOR IMPROVING LOW TEMPERATURE CURRENT GAIN OF BIPOLAR TRANSISTORS

[75] Inventors: Tze-Chiang Chen, Yorktown Heights, N.Y.; John D. Cressler, Fairfield, Conn.

[73] Assignee: International Business Machines Corporation, Armonk, N.Y.

[21] Appl. No.: 689,673

[22] Filed: Apr. 23, 1991

Related U.S. Application Data

[63] Continuation of Ser. No. 472,688, Jan. 31, 1990, abandoned.

[51] Int. Cl.⁵ ............... H01L 21/328; H01L 21/265
[52] U.S. Cl. .................................. 437/31; 437/27; 437/150; 748/DIG. 10; 748/DIG. 2
[58] Field of Search ............ 437/31, 32, 33, 27, 437/150; 357/34; 748/DIG. 2, DIG. 10

[56] References Cited

U.S. PATENT DOCUMENTS

| | | |
|---|---|---|
| 4,226,650 | 10/1980 | Takahashi et al. ............... 357/34 |
| 4,523,370 | 6/1985 | Sullivan et al. .......... 148/DIG. 11 |
| 4,557,296 | 3/1986 | Wong . |
| 4,559,696 | 12/1985 | Anand et al. . |
| 4,641,416 | 2/1987 | Iranmanesh et al. .............. 437/31 |
| 4,889,819 | 12/1989 | Davari et al. ..................... 437/27 |

FOREIGN PATENT DOCUMENTS 59-17243  1/1984  Japan .

OTHER PUBLICATIONS

Dumke, W. P., "The Effect of Base Doping on the Performance of Si Bipolar Transistors at Low Temperatures", *IEEE Transactions on Electron Devices*, 28(5):494 (1981).

Cressler, J. D., et al., "On the Low-Temperature Static and Dynamic Properties of High-Performance Silicon Bipolar Transistors", *IEEE Transactions on Electron Devices*, 36(8):1489 (1989).

Tang, D. C., "Heavy Doping Effects in PNP Bipolar Transistors", *IEEE Transactions on Electron Devices*, 27(3):563 (1980).

Woo, J., et al., "Optimization of Bipolar Transistors for Low Temperature Operation", *IEDM Technical Digest*, 401 (1987).

Stork, J. M. C., et al., "High Performance Operation of Silicon Bipolar Transistors at Liquid Nitrogen Temperatures", *IEDM Technical Digest*, 405 (1987).

Wolf, et al., Silicon Processing for the VLSI Era, vol. 1, Lattice Press, 1986, pp. 136-139, 156-158, 176-183, 280-283, 324-327.

*Primary Examiner*—T. N. Quach
*Attorney, Agent, or Firm*—Scully, Scott, Murphy & Presser

[57] ABSTRACT

A method for improving the low temperature current gain of silicon bipolar transistors by implanting a first and a second impurity of the same conductivity type into the base region to provide a high doping level base that increases bandgap narrowing without decreasing freeze-out activation energy. The second impurity is selected to have a higher ionization energy that that of the first impurity. The second impurity thereby freezes out sooner than the first impurity resulting in the freeze-out activation energy being equal to or greater than the energy with only the first impurity.

18 Claims, 2 Drawing Sheets

METHOD FOR IMPROVING LOW TEMPERATURE CURRENT GAIN OF BIPOLAR TRANSISTORS

This application is a continuation, of application Ser. No. 472,688, filed on Jan. 31, 1990 abandoned.

BACKGROUND OF THE INVENTION

1. Field of the Invention

The present invention is directed to the fabrication of bipolar transistors and more particularly, to improving the current gain of bipolar transistors at low temperatures.

2. Description of the Prior Art

The operation of semiconductor devices at low temperatures has been used traditionally as a tool for exploring device physics. In the past several years, however, increasing emphasis has been placed on using the low temperature environment to enhance the performance of integrated circuits. The principal driving force in this trend has been the silicon complementary metal oxide semiconductor (CMOS) technologies which has resulted in the design and manufacture of a supercomputer operational at liquid nitrogen ($LN_2$) temperatures. The advantages of the low temperature environment for FET transistors are many, and include enhanced carrier mobility and reduced leakage currents.

Despite the advantages offered by low temperature operation of CMOS circuits, the high sensitivity of field effect transistor (FET) technologies to capacitive loading is undesirable. Because significant circuit loading is inevitable regardless of operating temperature, this inherent shortcoming of CMOS technologies will remain in the $LN_2$ environment. Attempts at integrating CMOS technologies with bipolar technologies (BiCMOS) that are capable of efficiently driving high capacitance loads because of their high transconductance have been quite successful in recent years. At the chip level significant room temperature performance improvements have been reported over conventional CMOS technologies Operation of BiCMOS circuits at $LN_2$ temperatures, however, has received very little attention. The primary reason for this is the well known degradation of bipolar transistor characteristics at reduced temperatures. The principal device parameter that has been studied over the years is the transistor current gain beta ($\beta$), which is typically observed to decay exponentially with decreasing temperature. The beta degradation is commonly associated with the difference in apparent bandgap narrowing between the base and emitter regions. The result is that device gain is very small (or non-existent) at $LN_2$ temperatures, thereby precluding any consideration of bipolar transistors in low temperature applications.

There have been two basic techniques proposed to reduce this degradation of beta at low temperatures. The first has been to severely reduce the emitter doping level in the device in order to reduce the amount of apparent bandgap narrowing in the emitter as disclosed by Woo et al., Optimazation of Bipolar Transistors for Low Temperature Operation, IEDM Tech. Dig. (1987). This method, though successful in producing usable beta at low temperatures, is not consistent with the design requirements for high performance applications, however, for charge storage and emitter resistance reasons. The second technique is to increase the base doping level in the device to reduce the difference in apparent bandgap narrowing between the emitter and base regions as disclosed by Tang, Heavy Doping Effects in PNP Bipolar Transistors, IEEE Trans. Elec. Dev. ED-27 (1980) and Stork et al., High Performance Operation of Silicon Bipolar Transistors of Liquid Nitrogen Temperature, IEDM Tech. Dig. (1987). The latter technique is more consistent with traditional scaling laws but is limited because of the inherent emitter base leakage that results from any radical increase in the base doping level. In addition, it is known that this technique is not efficient for improving the low temperature beta because any increase in the bandgap narrowing in the base region which is beneficial to beta, is partially offset by a decrease in the freeze-out activation energy in the base region, which is a disadvantage to beta.

Techniques for improving emitter efficiency and hence increasing gain of bipolar transistors operating at room temperatures are known in the art. One such technique is disclosed in U.S. Pat. No. 4,559,696 which teaches the formation of a wide gap emitter by an additional ion implant of material having a higher energy gap then silicon subsequent to or simultaneously with the n or p-type doping of the emitter. The additional ion implant creates a potential barrier for the flow of holes from the base to the emitter that is greater than the potential barrier for the flow of electrons from the emitter to the base. The materials disclosed for the additional ion implant are carbon and nitrogen. While emitter efficiency and gain are improved in conventional room temperature operation, there is a need for an efficient method from improving the current gain of bipolar transistors at low temperatures.

SUMMARY OF THE INVENTION

The present invention is directed to a method for improving the low temperature current gain of bipolar transistors by introducing two impurities of the same conductivity type into the base region, with one impurity having a higher ionization energy than the other. A conventional bipolar transistor comprises an emitter region and a collector region of a first conductivity type and a base region of a second conductivity type opposite to the first type sandwiched between the emitter and collector regions. In a bipolar transistor formed in accordance with the present invention, the base region is doped with a first and a second impurity of the second conductivity type, with the second impurity having a higher ionization energy than the first impurity. The difference in ionization energy between the first and second impurities introduced into the base region must be sufficiently large such that the base has a low temperature activation energy approximately equal to or greater than the activation energy of the base region with only the first impurity. The ionization energy of the second impurity must be high enough so that the second impurity will freeze out much quicker than the first impurity as the temperature of the device drops from room temperature to low temperature, such as the temperature of liquid nitrogen. The freeze out of the second impurity results in the activation energy of the base region being greater than the activation energy of the region with only the first impurity. At the same time, because of the increased total doping concentration present, the apparent bandgap narrowing in the base at low temperature will increase over devices having typical doping concentration levels. Thus, in effect, a transistor which behaves like a widegap emitter transistor is formed at low temperatures without the decrease in freeze out activation energy that occurs in the prior art method of increasing the doping level of a single impurity.

DETAILED DESCRIPTION OF THE INVENTION

Figure 1:
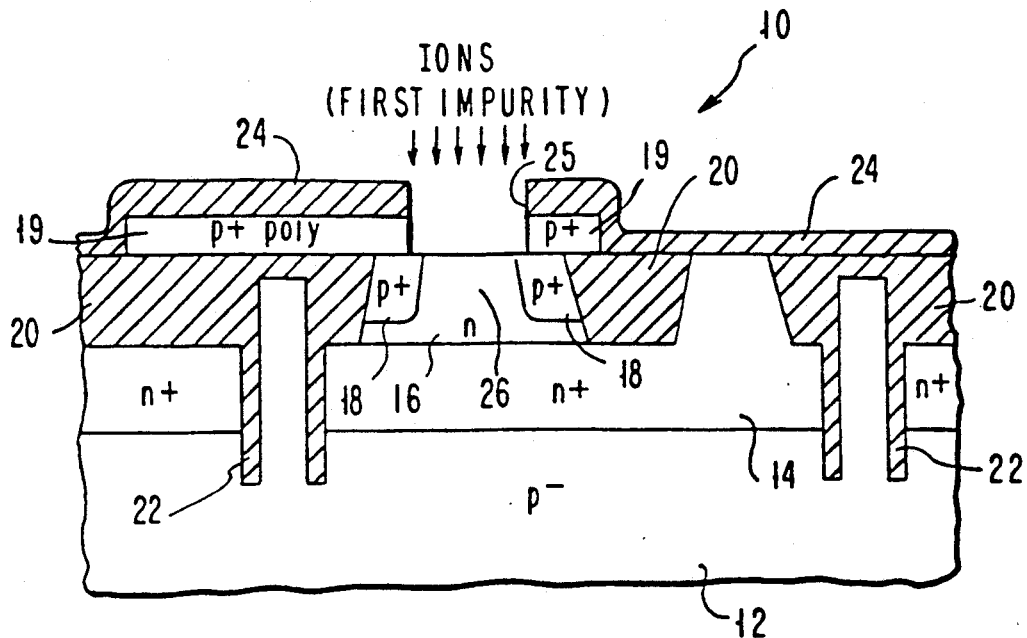
FIGS. 1 and 2 are cross-sectional illustrations of a bipolar transistor illustrating the step of introducing a first and second impurity into the base region.

In the following description of the invention, particular reference is made to the use of the invention in connection with the fabrication of NPN bipolar transistors, in order to facilitate an understanding of the invention. However, it will be appreciated by those having familiarity with integrated circuit technology that the applications of the inventions are not so limited and that it can be used with success in other types of transistors, e.g. PNP bipolar transistors.

The principles underlying in the present invention are explained herein below. One of the most important process related parameters needed to understand the low temperature operation of the bipolar transistor is the intrinsic base sheet resistance $R_{db}$ which lies directly underneath the emitter region. The intrinsic base sheet resistance is essentially a measure of the base profile of the device and depends on the neutral base width as well as the active base doping level. It is known that $R_{db}$ increases above room temperature due to enhanced phonon (lattice) scattering and begins to "freeze-out" at low temperatures in a quasi-exponential manner.

Dopant freeze-out phenomena is well known in the semiconductor art and can be understood qualitatively as follows: the number of ionized acceptors, for example, in a sample depends exponentially on the difference between the Fermi level and acceptor ionization energy. As temperatures are reduced the Fermi level moves closer to the band edge and it begins to become energetically favorable for the acceptors to remain neutral rather than become ionized. This neutralization of the acceptors removes holes from the valence band that were previously available for conduction, and thereby lowers the sample conductivity. The inventors have determined that the hole concentration in a p-type semiconductor compensated by donors depends on temperature chiefly through the acceptor activation energy and the valence band density of states.

Based on the above, the inventors have determined that by merely increasing the base doping level in an attempt to reduce the difference in apparent bandgap narrowing between the emitter and the base regions does not provide a desired improvement in the low temperature beta because of the decrease in the freeze-out activation energy in the base region. This result can be seen from the equation showing the temperature dependence of beta at low temperatures as follows:

$$\beta = \gamma(T)e^{(E_{Rdb}+\Delta E_{gb}-\Delta E_{ge})/kT}$$

where $E_{Rdb}$ is the low temperature activation energy of the intrinsic base resistance, $\Delta E_{ge}$ is the apparent bandgap narrowing in the emitter, $\Delta E_{gb}$ is the apparent bandgap narrowing in the base region, T is the temperature, and $\gamma$ is a weakly temperature dependent parameter comprised of carrier diffusion coefficients and effective masses.

The present invention improves the low temperature beta of silicon bipolar transistors by raising the doping levels in the base by doping the base with two impurities, with one impurity having a higher ionization energy than the other. For example, in addition to the traditional implantation of boron into the transistor to form the intrinsic base region, an additional implant of a second dopant having a higher ionization energy than boron, at an appropriate energy and dose, results in significantly improved beta at low temperatures.

Referring now to the Figures, there is shown a transistor commonly used in the silicon bipolar industry fabricated in accordance with the present invention. The transistor shown in the drawings is an advanced double polysilicon self-aligned structure. It is understood, however, that the invention is not limited to this type of transistor but may be applicable to any semiconductor device incorporating bipolar transistor technology. As shown in FIG. 1, the structure 10 is formed on a lightly p-doped silicon substrate 12. A layer of heavily n-doped silicon is deposited on the substrate 12 to form extrinsic collector region 14. Photolithography techniques are used to form an n-doped intrinsic collector region 16 and $p^+$-doped regions 18 in the silicon layer 14. Recessed field oxide regions 20 and deep trench isolation regions 22 typically of silicon dioxide and/or silicon nitride are used to isolate devices and minimize device parasitics.

A layer of polysilicon is then deposited on the structure which is thereafter patterned and etched to form extrinsic base regions 19. A suitable mask 24 is then applied and etched to open a doping window 25. Thereafter, region 26 is doped with a p-type impurity to form an intrinsic base region. Region 26 is typically doped by ion implantation but other techniques may also be utilized such as diffusion and in-situ doping during the silicon deposition.

Figure 2:
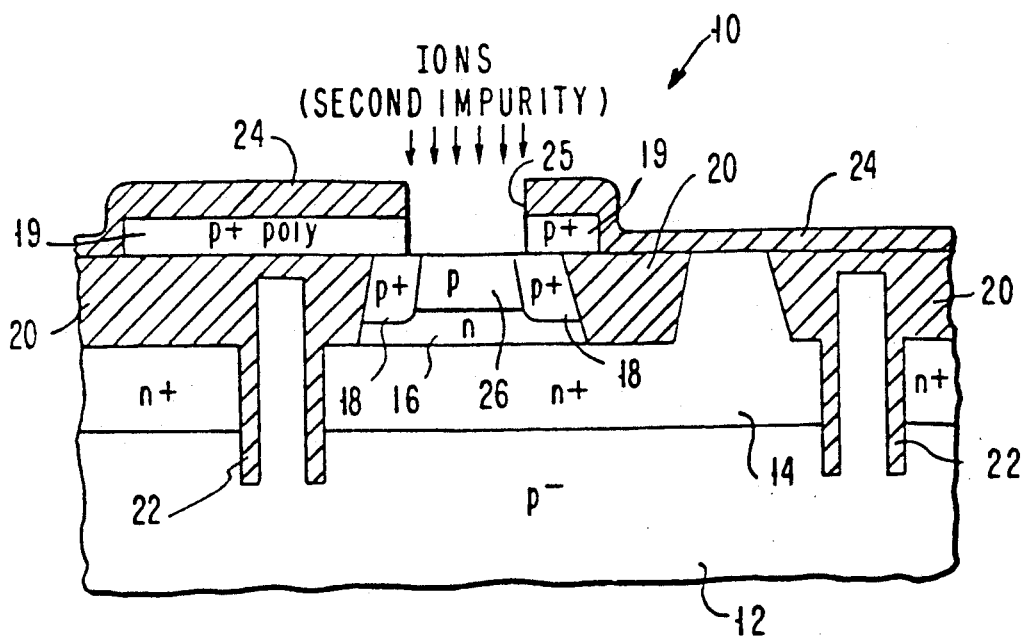

As shown in FIG. 2, in addition to the conventional p-type doping of base region 26, a second impurity having a p-type conductivity is also implanted into region 26. The dopant used for the second impurity must have a higher ionization energy than the material used to initially dope the base region. The implanting of the second impurity can be carried out subsequent to the implanting of the first impurity or, alternatively, it can be carried out simultaneously. Whether simultaneous or successive, the implantation of the second impurity does not require any additional masking steps, which facilitates the fabrication process.

Figure 3:
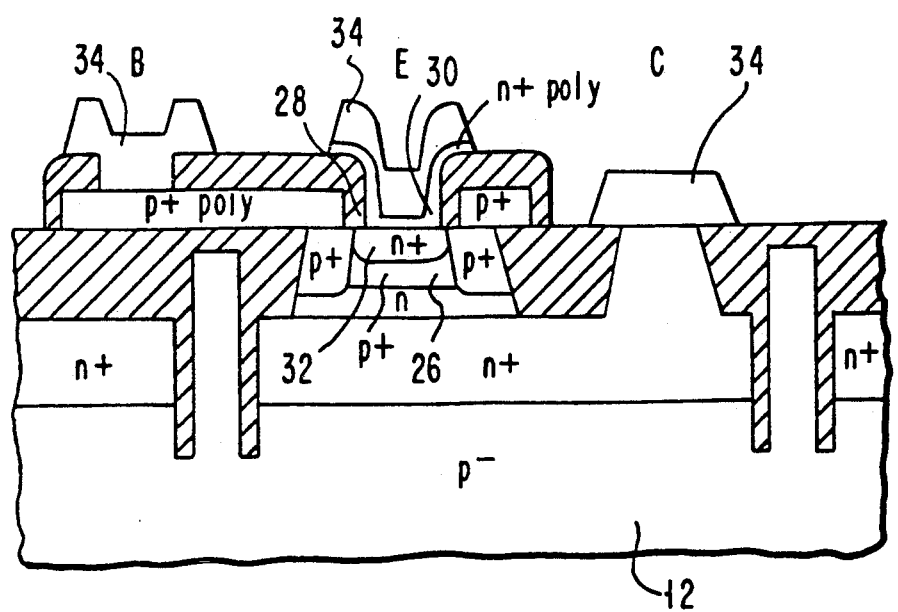
FIG. 3 is a cross-sectional illustration of a completed bipolar transistor fabricated in accordance with the method of the present invention.

As shown in FIG. 3, after the implantation of the second impurity, the device 10 is completed by depositing an oxide layer and etching to form sidewalls 28. Thereafter, heavily doped polysilicon 30 is deposited which diffuses into the region 26 to form an intrinsic emitter 32. The heavily doped n-type polysilicon 30 is used as the emitter contact. Suitable metal contacts 34 are then deposited by conventional mask and etch techniques.

The difference in ionization energy between the first and second impurities implanted in the base region must be sufficiently large to cause the low temperature activation energy to be equal to or greater than the activation energy with only the first impurity. The difference in ionization energies of the first and second impurities must be at least about 0.010 eV. Because of this difference, at low temperatures, the portion of the base profile attributable to the second impurity will freeze out much quicker than the portion of the base attributable to the first impurity which thereby increases the freeze-out activation energy of the intrinsic base resistance over the case with only first impurity. At the same time, $\Delta E_{gb}$ will be increased since the apparent bandgap narrowing depends to the first order on the doping concentration. The bandgap narrowing will typically be in the range of about 60 meV. Thus, at low temperature, the gain of a bipolar transistor made in accordance with the method of the present invention will have a gain of 20 or greater. For optimized transistors, the low temperature of gain would be on the order of 100.

The conventional p-type impurity is boron, but other p-type impurities may also be used as the first impurity, such as In and Ga. If boron is used as the first impurity material, indium is one material having a larger ionization energy than boron suitable for use as the second impurity. The ionization energy of indium is 0.160 eV while the ionization energy for boron is 0.045 eV resulting in an energy difference of 0.115 eV. Indium is suitable for shallow profile devices since it is heavier than boron resulting in less channelling, and because it has a much lower diffusion coefficient than boron. In addition, indium has a lattice constant much nearer to silicon than boron. Another suitable material for the second impurity when boron is used as a first impurity is gallium, which has an ionization energy of 0.065 eV which results in an energy difference of 0.020 eV. Other materials that may be used for the second impurity when boron is used as the first impurity include Al and Tl which have ionization energies of 0.057 eV and 0.260 eV, respectively. However, Ga and In are preferred because of their diffusion properties. When the first impurity is Ga or Al which have ionization energies of 0.065 and 0.057 eV, respectively, suitable materials for the second impurity include In and Tl, which have ionization energies of 0.160 and 0.260 eV, respectively.

The concentration of the first and second impurities is the typical range for bipolar device fabrication which is about $1 \times 10^{17}$ to $5 \times 10^{18}$ cm$^{-3}$ for the current state of the art. The concentration of the ions of the second impurity that are implanted in the base region is dependent upon the degree to which it is desired to increase the freeze-out activation energy. The concentration levels of the first and second impurities may be adjusted to provide the desired increase in the freeze-out activation energy and hence the desired increase in the low temperature gain. The levels may be similar for both the first and second impurity or the levels may differ with either the first or the second impurity having the higher level. The impurity dosage and the energy used to implant the ions of the second impurity is the control by which such an increase is achieved. For example, the freeze-out activation energy of a bipolar transistor such as that shown in FIG. 3, doped only with boron is typically about 5 to 30 meV for a doping concentration in the range of about $1 \times 10^{17}$ to $5 \times 10^{18}$ cm$^{-3}$. By implanting indium to a concentration of $1 \times 10^{17}$ to $5 \times 10^{18}$ cm$^{-3}$ at an energy of 10 to 50 eV and a dosage of about $5 \times 10^{12}$ to $5 \times 10^{13}$ cm$^{-2}$, the freeze-out activation energy at liquid nitrogen temperatures of the transistor would be increased to about 50 to 100 meV.

The inventors recognize that the enhanced freeze-out may cause an increase in base resistance at low temperatures. However, the inventors have determined that this increase in base resistance is not likely to be a limiting factor for properly designed transistors operating at high current levels where carrier injection determines the effective base resistance. Thus, for high performance bipolar transistor designs, such as the double polysilicon structure shown in the drawings, any slight increase in base resistance will not be a limiting factor.

As indicated above, the present invention also applies for PNP devices where a second donor impurity with a higher ionization energy than those currently used would be implanted. The n-type impurities for the base in a PNP transistor are typically P and As, and an n-type impurity having a higher ionization energy that can be used as the second impurity is Bi.

One of the significant advantages of the bipolar transistors of the present invention is the improved gain at liquid nitrogen temperatures. Transistors formed in accordance with the method of the present invention do not exhibit a degradation of the gain from room temperature to low temperature as found in the prior art transistors. The increased doping level in the base due to the second impurity results in an increase in the bandgap narrowing in the base region which facilitates the high gain at low temperatures. The selection of the second impurity having a higher ionization energy prevents a decrease in the freeze-out activation energy and results in an increase in that energy which also acts to improve the gain of the transistors at low temperature.

In addition, the use of two dopants with different ionization energies in the base region will also have other significant advantages to bipolar fabrication and the same is contemplated herein. For example, the higher ionization energy dopant, such as In, can be used as a pre-amorphization implant before the traditional boron base implant to obtain a shallower profile than a direct implantation process. The implantation dose and energy can be adjusted accordingly to provide the desired profile.

While the invention has been particularly shown and described with respect to preferred embodiments thereof, it should be understood by those skilled in the art that the foregoing and other changes in form and detail may be made therein without departing from the spirit and scope of the invention which should be limited only by the scope of the appended claims.

Having thus described in the invention, what is claimed as new, and is described to be secured by Letters Patents is:

1. A method of improving the gain at a temperature of below about 80K of a bipolar transistor having an emitter region and a collector region of a first conductivity type and a base region of a second conductivity type opposite to said first type sandwiched between said emitter and collector regions, said base region having an intrinsic and an extrinsic region, comprising the step of:

introducing a first and second impurity of said second conductivity type into said intrinsic base region, said second impurity having an ionization energy of at least approximately 0.010 eV greater than said first impurity such that the base region has an activation energy at said low temperature at least approximately equal to the activation energy of the base region doped with only the first impurity.

2. The method of claim 1 wherein the difference in ionization energy between said first and second impurities of said second conductivity type is in the range of between about 0.010 eV and 0.20 eV.

3. The method of claim 1 wherein said first conductivity type is n-type and said second conductivity type is p-type and wherein said first p-type impurity is selected from the group consisting of boron, Ga and Al, and said second p-type impurity is selected from the group consisting of indium, gallium, Al and Tl.

4. The method of claim 3 wherein said transistor is formed on a silicon substrate and said first p-type impurity is boron and said second p-type impurity is indium.

5. The method of claim 4 wherein the concentrations of boron and indium are about the same.

6. The method of claim 1 wherein said first conductivity type is p-type and said second conductivity type is n-type and wherein said first n-type impurity is selected from the group consisting of P and As, and said second n-type impurity is Bi.

7. The method of claim 6 wherein said transistor is formed on a silicon substrate and said first n-type impurity is P and said second n-type impurity is Bi.

8. The method of claim 7 wherein the concentrations of P and Bi are about the same.

9. The method of claim 1 wherein the concentration of said first impurity of said second conductivity type is in the range of about $1 \times 10^{17}$ to $5 \times 10^{18}$ cm$^{-3}$ and the concentration of said second impurity of said second conductivity type is in the range of about $1 \times 10^{17}$ to $5 \times 10^{18}$ cm$^{-3}$.

10. The method of claim 1 wherein said first and second impurities of said second conductivity type are introduced simultaneously.

11. The method of claim 1 wherein said first and second impurities of said second conductivity type are introduced in succession.

12. The method of claim 1 wherein said first and second impurities of said second conductivity type are introduced by ion implantation.

13. The method of claim 1 wherein said first and second impurities of said conductivity type are introduced by MBE.

14. The method of claim 1 wherein said first and second impurities of said conductivity type are introduced by CVD.

15. A method of improving the gain at a low temperature of below about 80K of a bipolar transistor having an emitter region and a collector region of a first conductivity type and a base region doped with a first impurity of a second conductivity type opposite to said first type sandwiched between said emitter and collector regions, comprising the step of:

introducing a second impurity of said second conductivity type into said base region, said second impurity having an ionization energy of at least approximately 0.010 eV greater than said first impurity and being of a concentration to provide a gain at said lower temperature in the range of 20 to 100.

16. The method of claim 26 wherein the difference in ionization energy between said first and second impurities of said second conductivity type is in the range of between about 0.010 eV and 0.20 eV.

17. The method of claim 15 wherein the concentration of said second impurity of said second conductivity type is sufficient to provide bandgap narrowing at said low temperature in the range of about 60 meV.

18. The method of claim 17 wherein the concentration of the first and second impurities of the second conductivity type are about the same.

* * * * *

UNITED STATES PATENT AND TRADEMARK OFFICE
CERTIFICATE OF CORRECTION

PATENT NO. : 5,185,276
DATED : February 9, 1993
INVENTOR(S) : Tze-Chiang Chen, et al.

It is certified that error appears in the above-identified patent and that said Letters Patent is hereby corrected as shown below:

In the Abstract, line 7: "that that" should read --than that--

Column 1, line 42 after "technologies" insert --.--

Column 3, line 63:
"$\beta = \gamma(T)e\ (E_{Rdb}+\Delta E_{gb} -- \Delta E_{ge})/kT$" should read
--$\beta = \gamma(T)\ e^{(E_{Rdb}+\Delta E_{gb}-\Delta E_{ge})/kT}$--

Column 6, line 48: "described" should read --desired--

Column 8, line 22, Claim 15: "lower" should read --low--

Column 8, line 23, Claim 16: "claim 26" should read --claim 15--

Signed and Sealed this

Sixteenth Day of November, 1993

Attest:

BRUCE LEHMAN

*Attesting Officer*     *Commissioner of Patents and Trademarks*